United States Patent [19]

Noh

[11] Patent Number: 5,785,871
[45] Date of Patent: Jul. 28, 1998

[54] PROCESS FOR MINUTE PROCESSING OF DIAMONDS

[75] Inventor: Hyun Pil Noh, Cheongju-si, Rep. of Korea

[73] Assignee: LG Semicon Co., Ltd., Chungcheongbuk-do, Rep. of Korea

[21] Appl. No.: 703,774

[22] Filed: Aug. 27, 1996

[30] Foreign Application Priority Data

Apr. 12, 1996 [KR] Rep. of Korea ............... 11068/1996

[51] Int. Cl.$^6$ .................................................. H01L 21/00
[52] U.S. Cl. .................... 216/2; 216/40; 216/56; 216/58; 216/76; 216/79; 252/79.1
[58] Field of Search ............................. 216/2, 40, 56, 216/58, 76, 79; 438/400; 252/79.1

[56] References Cited

U.S. PATENT DOCUMENTS 5,344,526  9/1994  Nishibayashi et al. .
5,366,923  11/1994  Beyer et al. .
5,538,911  7/1996  Yamazaki .

*Primary Examiner*—Samuel Barts
*Attorney, Agent, or Firm*—Birch, Stewart, Kolasch & Birch, LLP

[57] ABSTRACT

A process for the minute processing of diamonds which comprises preparing a substrate;

forming a first buffer layer on the substrate;

forming a second buffer layer, having a higher charge transfer rate than both the substrate and the first buffer layer, on the first layer;

selectively removing the first and second buffer layers to selectively expose the surface of the substrate;

depositing diamonds on the whole surface of the exposed surface of the substrate and the remaining first and second buffer layer; and removing the by-products formed on the surface of the second buffer layer and surface thereof.

15 Claims, 1 Drawing Sheet

PROCESS FOR MINUTE PROCESSING OF DIAMONDS

FIELD OF THE INVENTION

The present invention relates to a process for processing diamonds, more specifically, to a process for the minute processing of diamonds.

BACKGROUND OF THE INVENTION

As processes for processing diamonds, a process using a laser and a process using an ionized beam have been generally used.

In the process of using a laser, an excimer laser such as KrF or ArF is used. The laser operates at a frequency of 50 to 100 Hz, and is used to form a deep pattern or a hole on the diamond of 10 μm thickness.

In other words, an excimer laser such as KrF or ArF is irradiated onto the surface of a diamond film under a proper oxygen atmosphere to partially remove C clusters by burning.

In the process of using an ionized beam, the ionized beam is merely used in place of the laser mentioned above.

A desired pattern is formed by irradiating the ionized beam focused on a diamond film to remove the unnecessary part of the diamond film. In other words, the potential of the ionized beam from a Ga ion source is accelerated to a fixed point of about 25 KeV. Then, a desired pattern is formed by continuously radiating the Ga ionized beam in one direction onto the parts of the diamond film desired to be removed.

However, the conventional methods of processing diamonds or diamond surfaces using the laser or ionized beam techniques mentioned above have the following problems:

First of all, the cost of these techniques is very high because both methods require expensive equipment.

Secondly, the processing time of the method using an excimer laser is long and has no relationship between the process and conventional processes for manufacturing semiconductors.

Thirdly, in the case of using an ionized beam, radiation with an ionized beam depends on sputtering which causes additional damage.

SUMMARY OF THE INVENTION

The object of the present invention is to overcome the above mentioned problems and to provide a process for the minute processing of diamonds, which is useful in the minute pattern formation of a diamond.

The process according to the present invention in order to achieve the above object comprises the steps of preparing a substrate;

forming a first buffer layer on the substrate;

forming a second buffer layer on said first buffer layer, said second buffer layer having a higher charge transfer rate than the substrate and the first buffer layer;

selectively removing parts of the first and second buffer layers to expose predetermined parts of the surface of the substrate;

depositing diamond on the whole surface of the exposed surface of the substrate and the remaining first and second buffer layers; and removing by-products formed on the surface of the second buffer layer as well as the second buffer layer itself.

BRIEF DESCRIPTION OF THE DRAWINGS

The present invention will become more fully understood from the detailed description given hereinbelow and the accompanying drawings which are given by way of illustration only, and thus, are not limitative of the present invention, and wherein.

DETAILED DESCRIPTION OF THE PREFERRED EMBODIMENT

The present invention will now be described by referring to the figures attached hereto.

Figure 1A:
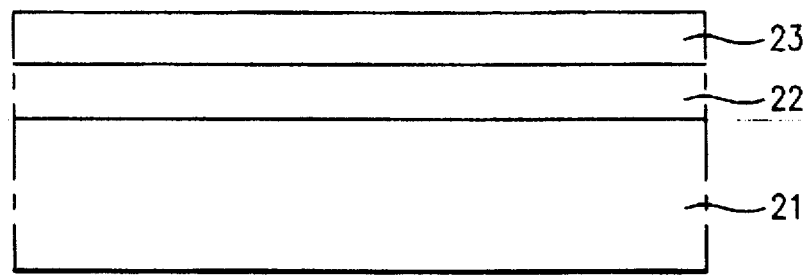
FIGS. 1A, 1B, and 1C are sectional views showing the process for the minute processing of diamonds according to the present invention.
Figure 1B:
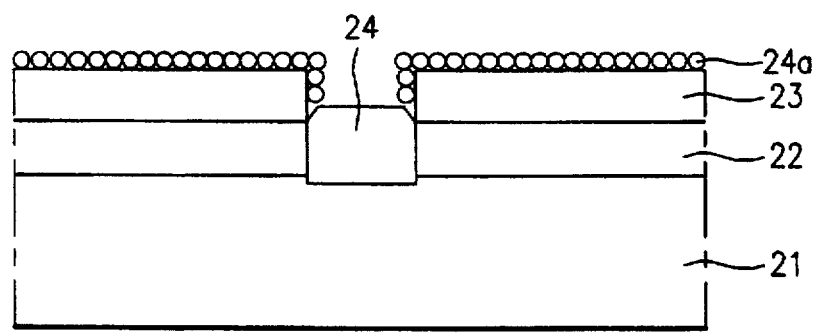
Figure 1C:
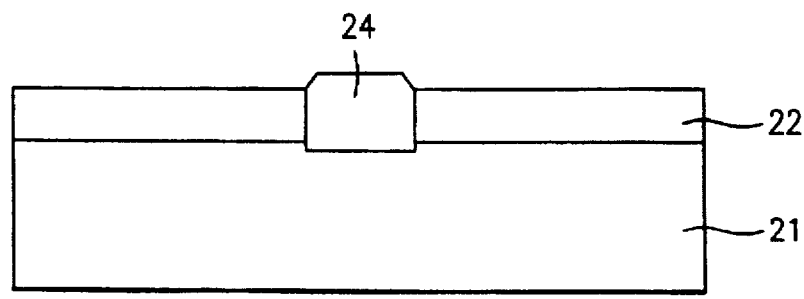

FIGS. 1A to 1C are sectional views showing the process for the minute processing of diamonds according to the present invention.

Firstly, the first buffer layer 22 and the second buffer layer 23 are sequentially formed on the substrate 21. The substrate 21 is made of a semiconductor material, a nonconductor material or a specific metal. The first buffer layer 22 is also formed by using a semiconductor material, e.g. silicon, a nonconductor material or a specific metal. As a nonconductor material, insulators, an oxide, e.g. $SiO_2$, a nitride, e.g. $Si_3N_4$, or a carbide, for example SiC, may be used. As a specific metal, Au, W, Ta or Ti may be used.

According to an embodiment of the present invention, the substrate 21 is made of a semiconductor material, the first buffer layer 22 is made of nonconductor material, and the second buffer layer 23 is made of a metal such as Fe, Pt, Pd, Rh or Ni. As the second buffer layer 23 does not satisfy selective growth, it is formed by sputtering. The second buffer layer can be described as having a higher electrochemical response rate than the first buffer layer and the substrate.

Then, a photosensitive film (not shown in the figures) is coated on the upper side of the second buffer layer 23, in order to form a pattern to the part desired to be subject to the crystal growth of the diamond, as illustrated in FIG. 1B. The second buffer layer 23 and the first buffer layer 22 are sequentially etched by using, the pattern-formed on the photosensitive film, as a mask. At this time, the second buffer layer 23 is etched by using an etchant containing a halogen gas such as $BCl_3$, $CCl_4$, $Cl_2$, $CCeF_3$, $CF_4$, $CBCF_3$, $SF_6$, and the like. The first buffer layer 22 is also etched by using $CF_4/H_2$, $CHF_3$, $C_2F_6$, etc., as the etchant. At the time of etching the first buffer is layer 22, the layer is overetched to sufficiently expose the substrate 21 in order to effect close adhesion with the substrate 21.

Subsequently, diamond is deposited by CVD (Chemical Vapor Deposition). At this time, a diamond crystal grows at the contacted portion between the substrate 21 and the first buffer layer 22, and diamond soot 24a grows on the surface of the second buffer layer. Thus, diamonds grow as a soot on certain metals having a high charge transfer rate, e.g. Fe, Pt, Pd, Rh, Ni, etc., whereas it grows as a crystal on the surface of other metals, e.g. Au, W, Ta, Ti, etc., semiconductors or nonconductors.

During the CVD of diamond, the temperature should be maintained at 800° C. or less, e.g. 600 to 800, and the gas used in the deposition is a gas composition containing 0.1 to 4% $CH_4$, 0 to 0.5% $O_2$ with the substantial balance being $H_2$.

Subsequently, the diamond soot 24 on the upper side of the second buffer layer 23, as well as the second buffer layer itself are sequentially removed, as illustrated in FIG. 1C. At this time, the diamond soot 24a is easily removed by washing due to the weak binding force thereof.

As described above, the process for the minute processing of diamonds according to the present invention is advantageous in that it enables the formation of a minute pattern of diamonds which does not require expensive equipment and provides a shortened processing time.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A process for the minute processing of diamonds, which comprises the steps of preparing a substrate;

forming a first buffer layer on the substrate;

forming a second buffer layer, having a higher charge transfer rate than both the substrate and the first buffer layer, on the first layer;

removing a selective portion of the first and second buffer layers to expose a selective surface of the substrate;

depositing diamonds on the entire surface of the exposed portion of the substrate and the remaining first and second buffer layers; and sequentially removing the by-products formed on the surface of the second buffer layer as well as the second buffer layer itself.

2. The process according to claim 1, wherein the substrate is made of a material selected from the group consisting of semiconductors, nonconductors, and metals.

3. The process according to claim 1, wherein the first buffer layer is made of a material selected from the group consisting of semiconductors, nonconductors, and metals.

4. The process according to claim 1, wherein the second buffer layer is formed of a metal selected from the group consisting of Fe, Pt, Pd, Rh, and Ni.

5. The process according to claim 1, wherein the deposition of diamond is carried out by chemical vapor deposition.

6. The process according to claim 1, wherein diamond soot is formed on the second layer as a by-product.

7. The process according to claim 2, wherein the nonconductor is selected from the group consisting of oxides, nitrides, and carbides.

8. The process according to claim 6, wherein the by-products formed on the second buffer layer are removed by washing.

9. The process according to claim 1, wherein the second buffer layer is formed by a sputtering process.

10. The process according to claim 1, wherein the deposition of diamonds is performed at a temperature of 800° C. or less.

11. The process according to claim 1, wherein the second buffer layer is etched by using an etchant containing a halogen gas.

12. The process according to claim 1, wherein the gas used in the diamond deposition comprises 0.1 to 4% of $CH_4$, 0 to 0.5% of $O_2$, with the substantial balance being $H_2$.

13. The process according to claim 2, wherein the metal is selected from the group consisting of Au, W, Ta, and Ti.

14. The process according to claim 2, wherein the nonconductor material is etched using $CF_4/H_2$, $CHF_3$ or $C_2F_6$ as the etchant.

15. The process according to claim 11, wherein the halogen gas is $BCl_3$, $CCl_4$, $Cl_2$, $CCeF_3$, $CF_4$, $CBCF_3$ or $SF_6$.

* * * * *